United States Patent
Yamamoto

(10) Patent No.: US 8,956,494 B2
(45) Date of Patent: Feb. 17, 2015

(54) METHOD OF ADHERING HARD SILICONE RESIN, METHOD OF ADHERING SUBSTRATE HAVING FINE STRUCTURE, AND PREPARATION METHOD OF MICRO FLUIDIC DEVICE UTILIZING ADHESION METHOD

(75) Inventor: Takatoki Yamamoto, Tokyo (JP)

(73) Assignee: Tokyo Institute of Technology, Tokyo (JP)

( * ) Notice: Subject to any disclaimer, the term of this patent is extended or adjusted under 35 U.S.C. 154(b) by 273 days.

(21) Appl. No.: 13/522,507
(22) PCT Filed: Jan. 19, 2011
(86) PCT No.: PCT/JP2011/000245
§ 371 (c)(1), (2), (4) Date: Oct. 22, 2012
(87) PCT Pub. No.: WO2011/089892
PCT Pub. Date: Jul. 28, 2011

(65) Prior Publication Data
US 2013/0037207 A1    Feb. 14, 2013

(30) Foreign Application Priority Data

Jan. 19, 2010 (JP) ................................. 2010-008956
Jul. 23, 2010 (JP) ................................. 2010-165916

(51) Int. Cl.
*B29C 65/14* (2006.01)
*B01L 3/00* (2006.01)
(Continued)

(52) U.S. Cl.
CPC ....... *B29C 65/1432* (2013.01); *B01L 3/502707* (2013.01); *B29C 59/14* (2013.01);
(Continued)

(58) Field of Classification Search
CPC ... B01L 3/502707; B29C 65/14; B32B 37/06; B05D 3/06

USPC ........................................... 156/272.2, 273.3
See application file for complete search history.

(56) References Cited

U.S. PATENT DOCUMENTS

| 2003/0145940 A1* | 8/2003 | Chaudhury et al. | 156/272.6 |
| 2004/0211511 A1* | 10/2004 | Suzuki | 156/273.3 |
| 2006/0169045 A1 | 8/2006 | Shinohara et al. | |

FOREIGN PATENT DOCUMENTS

| JP | 2004-074339 | 3/2004 |
| JP | 2004-325158 | 11/2004 |

(Continued)

OTHER PUBLICATIONS

Yamamoto et al., "Electrical Single-Molecule Detection in Nanochannel for Single-Molecular Sorter", IEEE Nano, 2009, pp. 1098-1101.

(Continued)

*Primary Examiner* — Daniel McNally
(74) *Attorney, Agent, or Firm* — Greenblum & Bernstein, P.L.C.

(57) ABSTRACT

A method for adhering a major substrate to which nano sized concave and convex structures are formed without damaging the concave and convex structures can be used in a production method of a microfluidic device including nano sized fluidic channels. The substrates may be adhered under heat free and adhesive agent free environment by exciting the substrate surface including hard silicone resin with atmospheric plasma or vacuum ultraviolet light, then juxtaposing and pressurizing the surface of the hard silicone resin substrate and glass substrate. The silicone rubber composition is applied on the contact face of the cover substrate and then the silicone rubber composition is cured to form the silicone rubber layer and then the ultraviolet light is exposed under the condition that the surface of the major substrate being formed with concave and convex structures is contacted closely to the silicone rubber layer of the cover substrate.

7 Claims, 6 Drawing Sheets

(51) Int. Cl.
  *B29C 59/14* (2006.01)
  *B29C 59/16* (2006.01)
  *B29C 65/48* (2006.01)
  *B29C 65/52* (2006.01)
  *B29C 65/82* (2006.01)
  *B29C 65/00* (2006.01)
  *B81C 3/00* (2006.01)
  *B29C 35/08* (2006.01)
  *B29L 31/00* (2006.01)

(52) U.S. Cl.
  CPC .......... *B29C 59/16* (2013.01); *B29C 65/1406* (2013.01); *B29C 65/1435* (2013.01); *B29C 65/4845* (2013.01); *B29C 65/521* (2013.01); *B29C 65/8215* (2013.01); *B29C 66/028* (2013.01); *B29C 66/1122* (2013.01); *B29C 66/474* (2013.01); *B29C 66/53461* (2013.01); *B29C 66/71* (2013.01); *B29C 66/73151* (2013.01); *B29C 66/73755* (2013.01); *B29C 66/7465* (2013.01); *B81C 3/001* (2013.01); *B29C 65/1483* (2013.01); *B29C 2035/0827* (2013.01); *B29C 2059/145* (2013.01); *B29L 2031/756* (2013.01); *B81B 2201/058* (2013.01); *B81C 2203/032* (2013.01); *B81C 2203/038* (2013.01); *B01L 2200/0689* (2013.01); *B01L 2300/0816* (2013.01); *B01L 2300/0896* (2013.01); *B01L 2300/123* (2013.01); *B01L 2300/16* (2013.01)
  USPC ..................................... 156/272.2

(56) References Cited

FOREIGN PATENT DOCUMENTS

| JP | 2004-331731 | 11/2004 |
|----|-------------|---------|
| JP | 2005-199394 | 7/2005  |
| JP | 2006-234791 | 9/2006  |
| JP | 2007-130836 | 5/2007  |
| JP | 2009-143992 | 7/2009  |

OTHER PUBLICATIONS

International Search Report issued with respect to PCT/JP2011/000245, mailed May 10, 2011.

* cited by examiner

Fig. 5
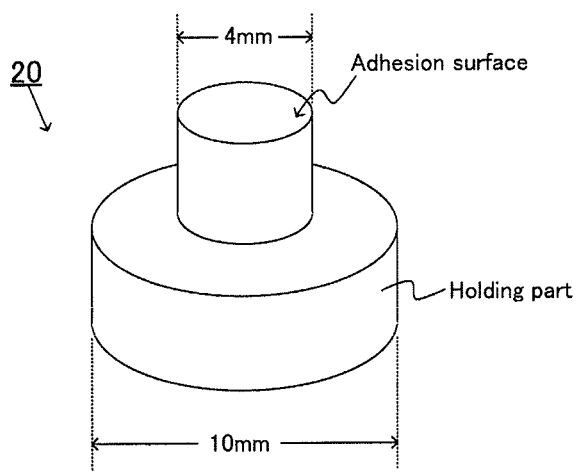
(a)
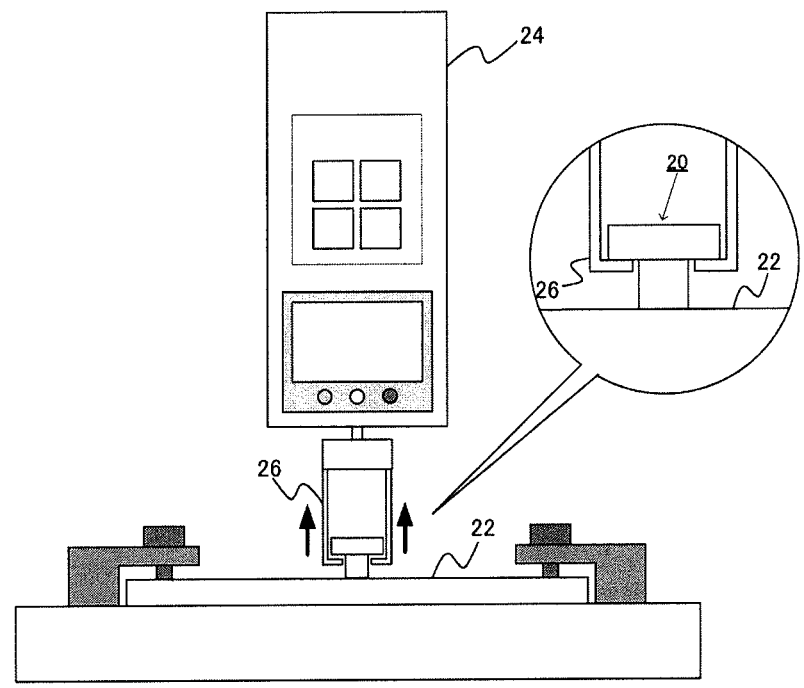
(b)

Fig. 6
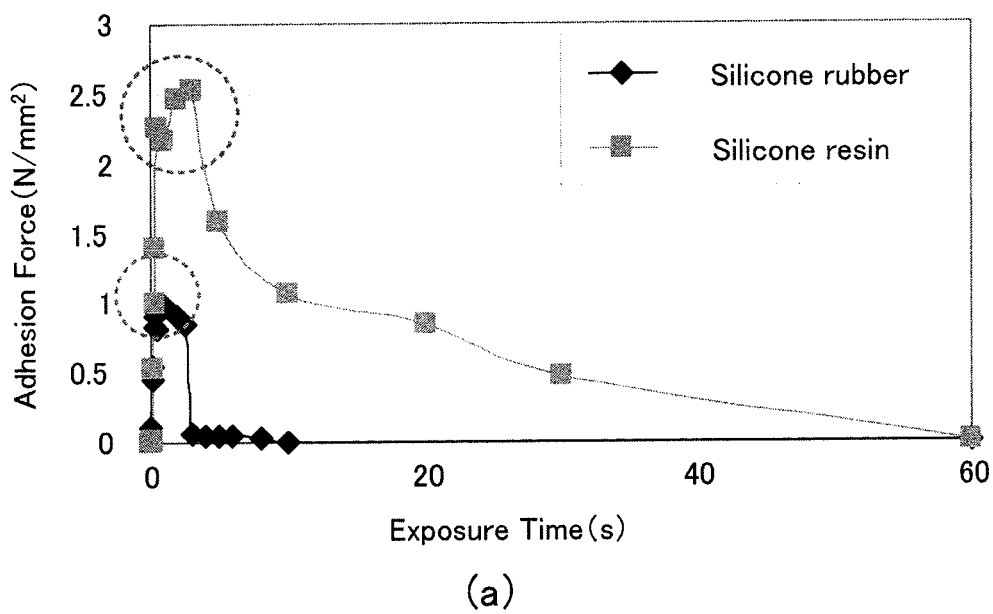
(a)
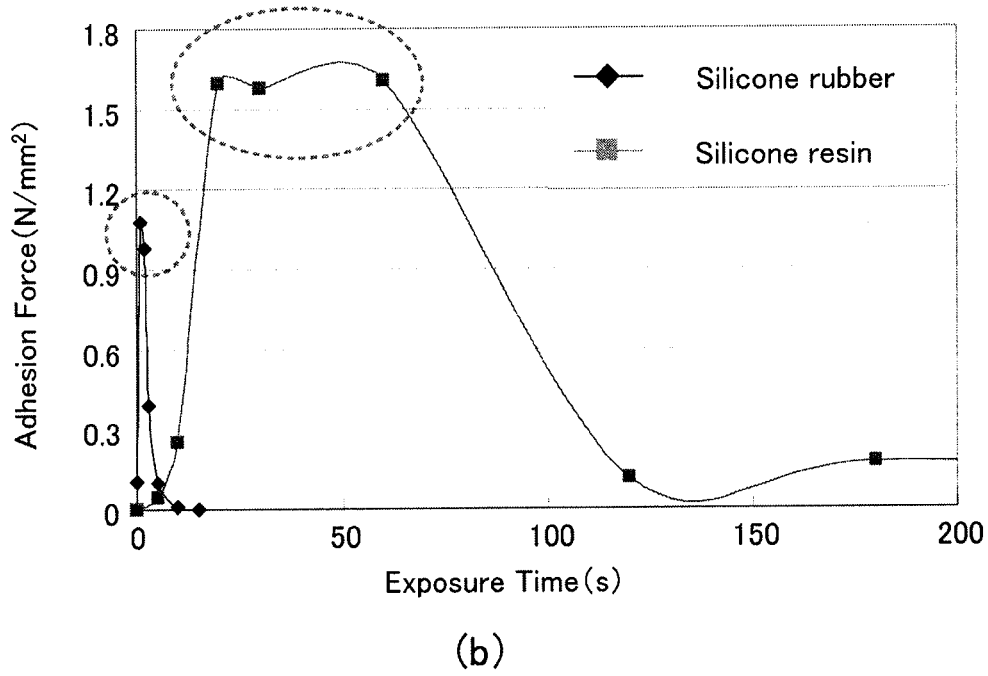
(b)

METHOD OF ADHERING HARD SILICONE RESIN, METHOD OF ADHERING SUBSTRATE HAVING FINE STRUCTURE, AND PREPARATION METHOD OF MICRO FLUIDIC DEVICE UTILIZING ADHESION METHOD

TECHNICAL FIELD

The present invention relates to a method of adhesion using silicone resin, and more particularly relates to a method of adhesion of hard silicone resin and a method for adhering between a major substrate having fine structures and a cover substrate.

Recently, microfluidic devices including micro channels becomes more popularly used for purposes of drug screening and DNA diagnosis in order to avoid waste of valuable regents and/or bio-samples as and also attaining high efficiency chemical reactions and/or analysis. In the microfluidic device, generally the miniaturized fluidic structures may be formed inside a chip by adhering a cover substrate for sealing on a major substrate on which fine recess structures (fluid path recesses) are formed. Conventionally, although two substrates have been adhered each other by thermal adhesion or by adhesion agents, there were problems in that the fine fluidic channels were destructed by thermal deformation of the substrates or adhesion agents flew into the fluidic channels to block the fluidic channels.

On the other hand, it has been known that the surface of silicone rubber may be modified so as to provide adhesion ability by exposing oxygen plasma and/or by exposing vacuum ultraviolet light thereon and an adhesion method which is free from heat and adhesion agents has been studied with paying attention to this property. In Japanese Patent (Laid-Open) No. 2007-130836 (Patent Literature 1) discloses a method for adhering substrates each other by exposing a surface of a polydimethylsiloxane (PDMS) substrate with the vacuum ultraviolet light for excitation thereof and then juxtaposing a glass substrates thereon.

Since the silicone rubber exemplified by PDMS is a soft material when compared to glass or silicon such that the device prepared by using the silicone rubber tends to be deformed; in the case of the microfluidic device, the fine fluidic channels formed in the device may be destructed. Furthermore, the silicone rubber has quite high gas permeability, and then the silicone rubber may not be used to the devices for which gas barrier performance may be required. Regarding to these aspects, it may be expected to adopt hard silicone resin having both of high hardness and high gas barrier performance as the substrate materials. However, unfortunately, there is no example for reporting that the hard silicone rubber exemplified by the silicone resin may be adhered through the surface excitation.

On the other hand, various studies have recently been made about molecular processing technology and Non Patent Literature 1 of the present inventor discloses single molecule sorter for fractioning biomolecules with one molecule by one molecule. To the major substrate of the single molecular sorter disclosed in Non Patent Literature 1, nano-sized fluid recesses are formed and micro electrodes used for impedance measurement on single molecules and switching operations are also disposed along with the fluid recesses. Then, the preparation method of this device must be practiced such that the cover substrate must be adhered to the major substrate that the fluid recesses (concave structures) and electrodes (convex structures) are both present therein without blocking the fluid recesses while covering the electrodes tightly. With respect to this strategy, the adhesion method of Patent Literature 1 could not be applied to the device preparation of the above described sorter because the method is applied at the condition that the major substrate surface has no convex structures.

PRIOR ART LITERATURE

Patent Literature

Patent Literature 1: Japanese Patent (Laid-Open) No. 2007-130836

Non-Patent Literature

Non-Patent Literature 1: 1: "Electrical Single Molecule Detection in Nanochannel for Single-Molecular Sorter", IEEE NANO 2009, pp. 1098-1101 (2009)

SUMMARY OF INVENTION

Object of Invention

The present invention has been completed regarding the above problems in the conventional arts and the object of the present invention is to provide a novel method for adhering hard silicone resin. Another object of the present invention is to provide a method for adhering the major substrate being formed with the nano-sized concave and convex structures to the cover substrate without damaging the concave and convex structures. Further another object of the present invention is to provide a method for preparing a microfluidic device comprising nano-sized fluidic channels using the above adhesion method.

Means for Addressing Object

The present inventor has been studied earnestly about a novel method for adhering hard silicone resin and as the result the present inventor has first found that the surface of the hard silicone resin exposed by atmospheric pressure plasma or by vacuum ultraviolet light shows significantly large adhesion power to complete the present invention.

According to the present invention, a method for adhering a hard silicone resin and a substrate may be provided. The method comprises the steps of: applying excitation treatment to a surface of a hard silicone resin; juxtaposing and pressurizing the surface and a substrate; and adhering the hard silicone resin and the substrate. The hard silicone resin may be silicone resin or organic modified silicone. The excitation treatment may be an exposure of atmospheric plasma or an exposure of vacuum ultraviolet light. The exposure energy of the vacuum ultraviolet light to the silicone resin may be preferred between 200 mJ/cm$^2$ and 1500 mJ/cm$^2$.

Furthermore, the inventor has earnestly studied a method for adhering a major substrate to which nano sized convex and concave structures are formed with a cover substrate without damaging the above concave and convex structures. As the result, the inventor has found the fact that both substrates adhere securely through silicon bonding formed at the contact interface by the process that a silicone rubber layer is formed on a contact face of the cover substrate and then ultraviolet light is exposed from the major substrate side under the condition that the surface of the major substrate having the convex and concave structures is closely contacted to the silicone rubber layer of the cover substrate.

Thus according to the present invention a method for adhering a major substrate and a cover substrate, the major substrate comprising a surface having both of convex structures and concave structures may be provided. The method comprises the steps of: applying a silicone rubber composition to a contact surface of a cover substrate; forming a silicone rubber layer at the contact surface of the cover substrate by curing the silicone rubber composition; contacting closely a surface of a major substrate and the silicone rubber layer of the cover substrate; and forming a siloxane bonding at an interface of the contact face between the silicone rubber layer and the major substrate by exposing the ultraviolet light from a major substrate side. According to the present invention, the ultraviolet light may be vacuum ultraviolet light. Further according to the present invention, a wavelength of the vacuum ultraviolet light may be 172 nm. Further according to the present invention, the concave structures and convex structures may be nano ordered sizes. The silicone rubber may be a thermal cure type and the silicone rubber layer may be formed by heating the silicone rubber composition from 60 Celsius degrees to 150 Celsius degrees. Further according to the present invention, a method of a microfluidic device comprising nano sized fluidic channels may be provided. The method comprises the steps of providing a quartz substrate having a surface being formed with both of electrodes and fluidic channels and a cover substrate for encapsulating the quartz substrate; applying a silicone rubber composition at a contact face of the cover substrate; forming a silicone rubber layer at the contact face of the cover substrate by curing the silicone rubber composition; contacting closely between the face of the quartz substrate and the silicone rubber layer of the cover substrate; an forming a silicone oxides film at an interface of the contact face between the silicone rubber layer and the major substrate by exposing vacuum ultraviolet light from a major substrate side.

Technical Advantage of Invention

As described above, according to the present invention, the novel method for adhering the hard silicone resin may be provided. Furthermore, according to the present invention, the method for adhering the major substrate being formed with the nano-sized concave and convex structures to the cover substrate without damaging the concave and convex structures.

BRIEF DESCRIPTION OF DRAWINGS

[FIG. 5] An apparatus for measurement of an adhesion force.
[FIG. 6] Relation between exposure time (s) and adhesion force (N/mm$^2$).

EMBODIMENT FOR PRACTICING INVENTION

Figure 1:
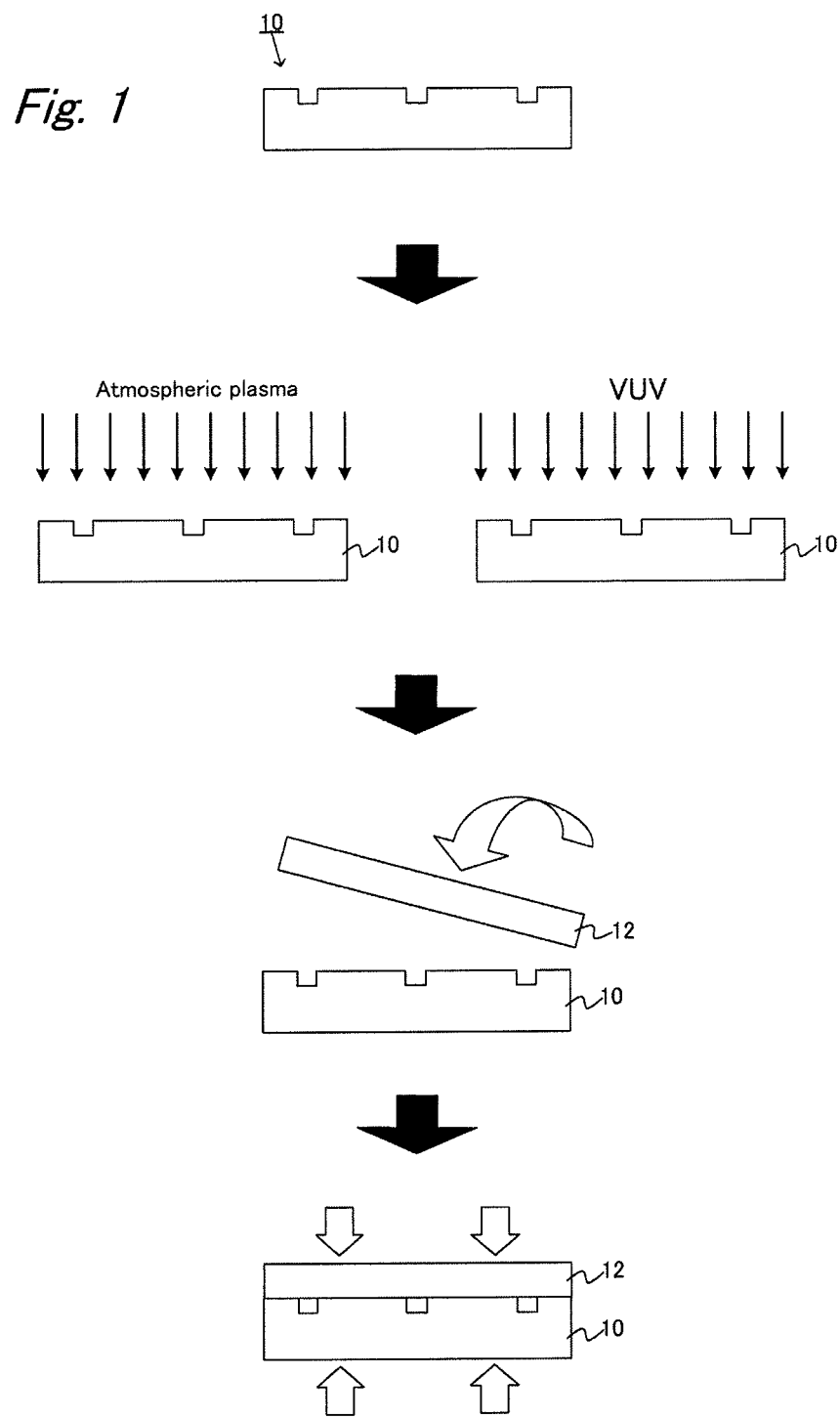
[FIG. 1] A scheme illustrates a production process of a microfluidic device.

Now, the present invention will be described using practical embodiments depicted in drawings; however, the present invention should not be limited by the embodiments depicted in the drawings. Here, in each of the drawings referenced hereunder, the same signs are provided with common elements and the descriptions for the common elements may be omitted for avoiding redundancy.

Hereunder, the adhesion method of the present hard silicone resin will be described based on the production process of the microfluidic device. FIG. 1 shows the scheme of the production process of the microfluidic device. The sign 10 of FIG. 1 refers the major substrate which is formed with fine concave structures (fluid recesses) on the surface. The major substrate 10 is made of the hard silicone resin having superior gas barrier property and to which the present adhesion method may be applied. Now, the hard silicone resin to which the present method is applied is generally defined as polymers which have three dimensional crosslink structures with high crosslink density and also have the polymer backbone structure comprising siloxane bonds as at least one part of the backbone structure.

As an exemplary example of the hard silicone resin may include silicone resin. The silicone resin comprises high density three dimensional crosslink structures of the siloxane bonds in a main chain and may include methyl silicone resin having methyl groups in a side chain, methyl phenyl silicone resin having phenyl groups in the side chain, and modified silicone resins (alkyd modified, epoxy modified or polyester modified). In addition to the above, various organic modified silicone that the backbone is formed with including at least siloxane bonds may be applied with the present adhesion method.

In the present adhesion method, first the adhesion surface of the major substrate 10 is activated. The activation process of the present invention may be conducted by exposing the atmospheric plasma to the major substrates 10 being formed with the fine concave structures as well as by exposure of the vacuum ultraviolet light (VUV) thereon.

The silicone resin has conventionally thought that the silicone resin could not exhibit sufficient adhesive force by the surface excitation treatments. The inventor has surprisingly found that the exposure of the atmospheric plasma to the silicone resin may provide sufficient adhesive force with the silicone resin.

Furthermore, the inventor also found that the sufficient adhesive force may be exhibited by irradiating the vacuum ultraviolet light (VUV). In this embodiment, the inventor has revealed that the exposure energy of the vacuum ultraviolet light to the silicone resin may be preferred between 200 mJ/cm$^2$ and 1500 mJ/cm$^2$, and more preferably between 350 mJ/cm$^2$ and 1100 mJ/cm$^2$. According to the present invention, the wavelength of the exposure vacuum ultraviolet light may preferably be 172 nm.

Lastly, the surface of the cover substrate 12, which is made of silicone rubber, silicone resin or hard materials containing Si (glass, quartz, silicon), is juxtaposed to the adhesive surface applied with the excitation treatment of the major substrate and then the pressure is applied to both of the substrates. As the result, siloxane bonds are formed at the contact face between the major substrates 10 having the fine concave structures and the cover substrate 12 such that both substrates are adhered strongly to form the microfluidic device. As such, according to the present invention the microfluidic device shown in FIG. 1 may be formed by using the hard silicone resin with superior gas barrier property as the substrate material through the heat and/or adhesive agent free method. As described above, when the microfluidic device is formed by the adhesion method of the present invention, since the usage of heat and/or adhesive agent upon adhering the substrates may be avoided, the destruction of the fine fluidic channels by thermal deformation or the block of the fine fluidic channels due to the adhesive agent flown into the fine fluidic channels.

In addition, the substrate materials are highly rigid and then the fine fluidic channels inside the chip may not be crushed by the deformation so that whole device may be prepared in high gas-barrier property.

Hereinabove, the adhesion method of the present hard silicone resin has been described based on the production method of the microfluidic device. In the production of the microfluidic device such as single molecule sorter for fractioning the biomolecules by single molecule basis, the cover substrate should be adhered to the fluid path recesses (concave structures) and the electrodes (convex structures) such that the fluidic channels may not be blocked and the electrodes are covered reliably. In order to realize the above features, further considerations may be expected. Now, these features may be explained.

Figure 2:
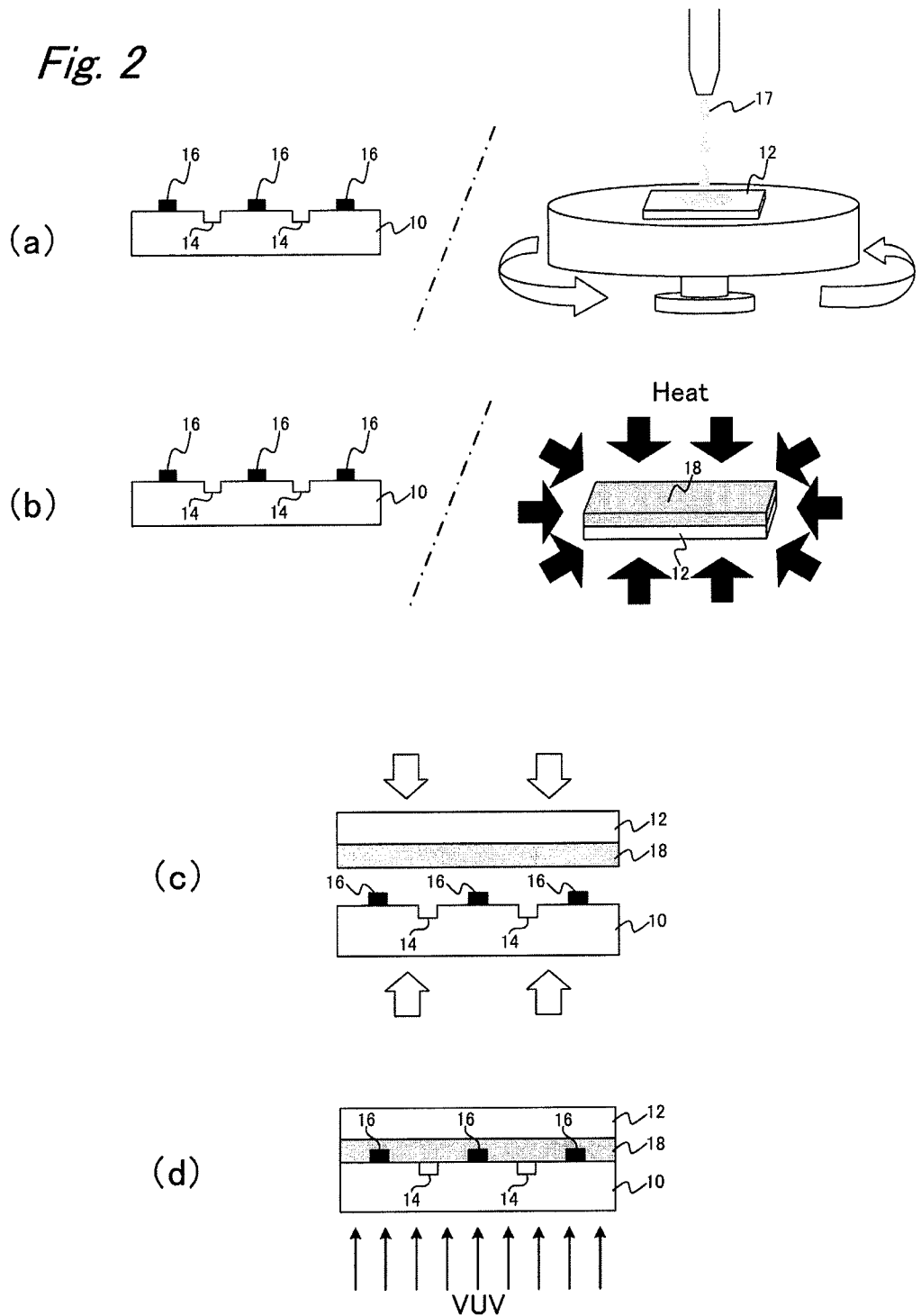
[FIG. 2] A scheme illustrates a production process of a microfluidic device.

FIG. 2 shows the scheme of the production process of the microfluidic device comprising the present nano fluidic channels.

According to the present invention as shown in FIG. 2, first the major substrate 10 being formed with the nano sized concave structures 14 and the nano sized convex structures 16 is prepared. The concave structures 14 are fluidic channels for defining chambers (spaces) thereafter providing the fluidic channels (including liquid reservoir). The depth and width of the fluid path may range from several nm to several hundreds nm. On the other hand, the convex structures 16 may be referred to electrodes for measurements and operations and the height and width may range from several nm to several hundred nm. Material to be used for the major substrate 10 may preferably be selected from materials transparent to the vacuum ultraviolet light. This reason will be detailed later. Here, the material of the major substrate 10 may be selected from any materials which may pass ultraviolet light; however, it may be preferred to be selected from hard materials as possible such that the nano sized chambers may not be crushed by deformation of the substrate. In addition according to the present invention, since the fluidic channels are in nano sized ones, more hydrophilic materials than PDMS, which is popularly used as the substrate material for conventional microfluidic device, may be preferred. Therefore, the major substrate 10 of the present invention may be preferably adopted as quartz.

In the present invention, the cover substrate 12 for encapsulating the fine structures on the major substrate 10 may also be prepared. As shown in FIG. 2(a), the silicone resin composition 17 in un-cured and liquid state is dropped onto the cover substrate 12 and the surface of the cover substrate 12 may be coated evenly by the silicone resin composition 17 by using a spin coating method. The silicone resin composition 17 of the present invention may be a room temperature cure type or may be a thermal cure type. Furthermore, the thickness of the coating layer of the silicone resin composition 17 may be preferably no more than 10 micrometers and more preferably not more than 1 micrometer. Here, in the description hereunder, the example using the thermal cure type silicone resin composition will be explained in detail for simplifying the description.

Next, as shown in FIG. 2(b), the cover substrate 12 to which the silicone resin composition 17 is evenly coated is baked to cure the silicone resin composition 17 resulting in formation of the silicone resin layer 18 on the surface of the cover substrate 12 without any tacking. According to the present invention, regarding to tight contacting at after the adhesion, the heating temperature at the bake may be preferably from 60 Celsius degrees to 150 Celsius degrees. Alternatively, when the convex structures 16 have the height not less than several nm (not more than 10 nm), the bake may be applied at about 200 Celsius degrees.

Then, as shown in FIG. 2(c), the surface of the cover substrate 12 to which the silicone resin layer 18 is formed and the surface of the major substrate 10 to which the concave and convex structures are formed are contacted each other and then both substrates are adhered securely by fixing at adequate positions and applying pressure. In this time, the silicone resin layer 18 has no tacking such that both substrates do not adhere immediately upon contacting of both substrates and then the positioning may be easily conducted. In this process, it may be preferred to drop methanol etc. on the surface of the major substrate 10 in order to enhance the lubrication between the contact surfaces beforehand.

Figure 3:
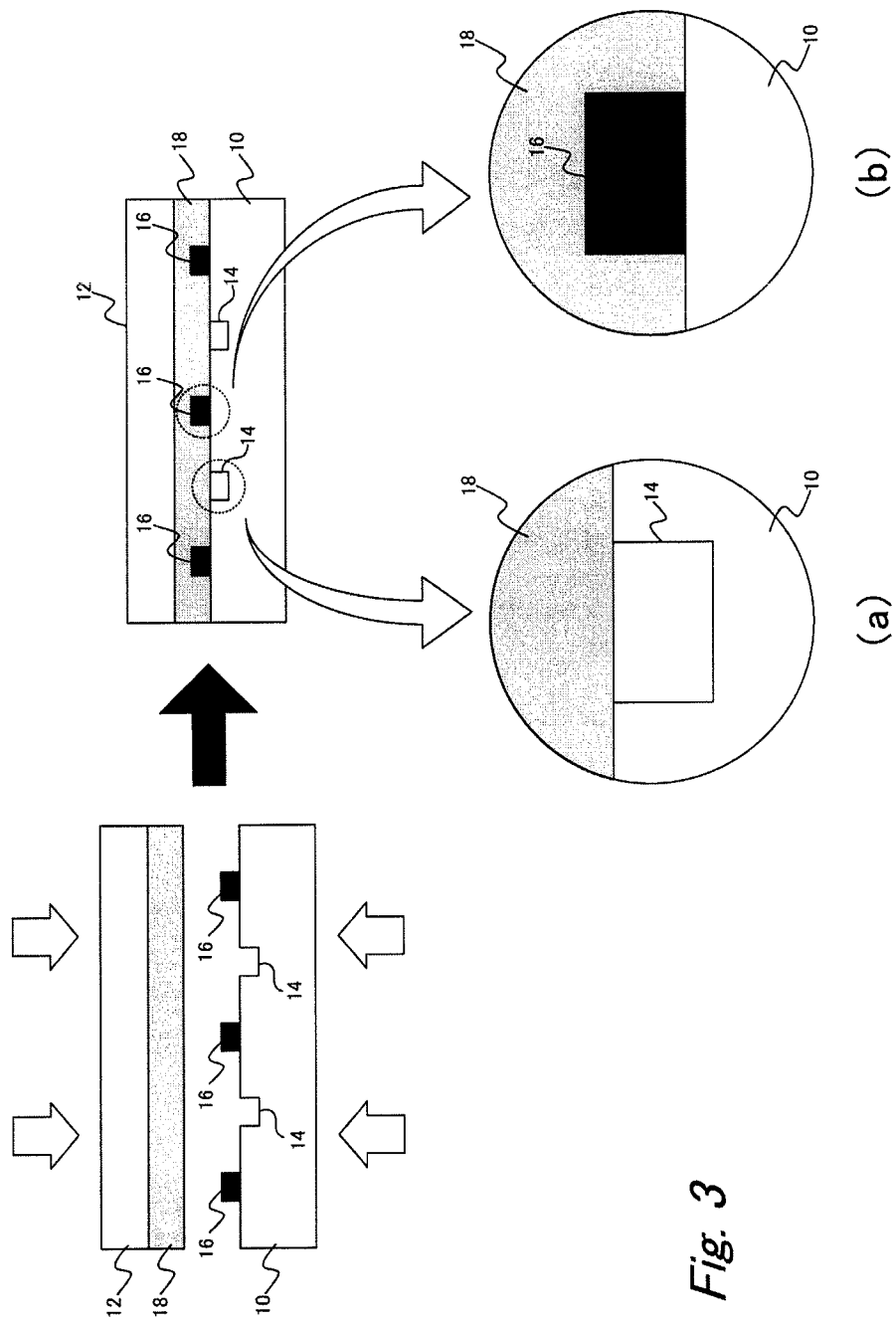
[FIG. 3] A scheme illustrates a process for contacting closely a cover substrate with a major substrate.

Now, the process of FIG. 2(c) will be detailed with referring to FIG. 3. In this process, the silicone resin layer 18 of the cover substrate 12 and the surface of the major substrate 10 to which the concave and convex structures are formed are contacted tightly by placing oppositely the surfaces and applying the pressure. In this embodiment, since the silicone resin 18 of the cover substrate 12 has the hardness not less than a predetermined level, the silicone resin could not flow into the concave structures 14 and then the silicone resin may not fill out the concave structures 14. After the adhesion of both substrates as shown in FIG. 3(a) the chambers (spaces) defined by the concave structures 14 may be kept as was. On the other hand, as shown in FIG. 3(b), since the silicone resin layer 18 of the cover substrate 12 has elasticity being different from hard materials such as quartz, the silicone resin layer 18 may cover throughout the convex structures 16. As the result, the cover substrate 12 and the major substrate 10 may be adhered tightly through the silicone resin layer 18 even though the convex structures 16 are present. According to the present invention, there is no particular limitation for materials of the cover substrate 12 and the cover substrate 12 may be made of resins or may be made of hard materials similar to the major substrate 10 (quartz, silicon, silicone resin, glass, metal, or ceramics).

The description will be continued again referring to FIG. 2. After the cover substrate 12 and the major substrate 10 by the silicone resin layer 18 are contacted tightly, the ultraviolet light or more preferably the vacuum ultraviolet light (VUV) may be exposed form the major substrate 10 side with keeping the tightly contacted condition. The major substrate 10 has, as described above, the transparency for the ultraviolet light and then the irradiated ultraviolet light may reach to the inside silicone resin layer 18 by passing through the major substrate 10. As the result, both substrates may be secured tightly by an oxide film formed at the contact face between the major substrate 19 and the silicone resin layer 18. In the present invention, the wavelength of the irradiated vacuum ultraviolet light may preferably be 172 nm.

Figure 4:
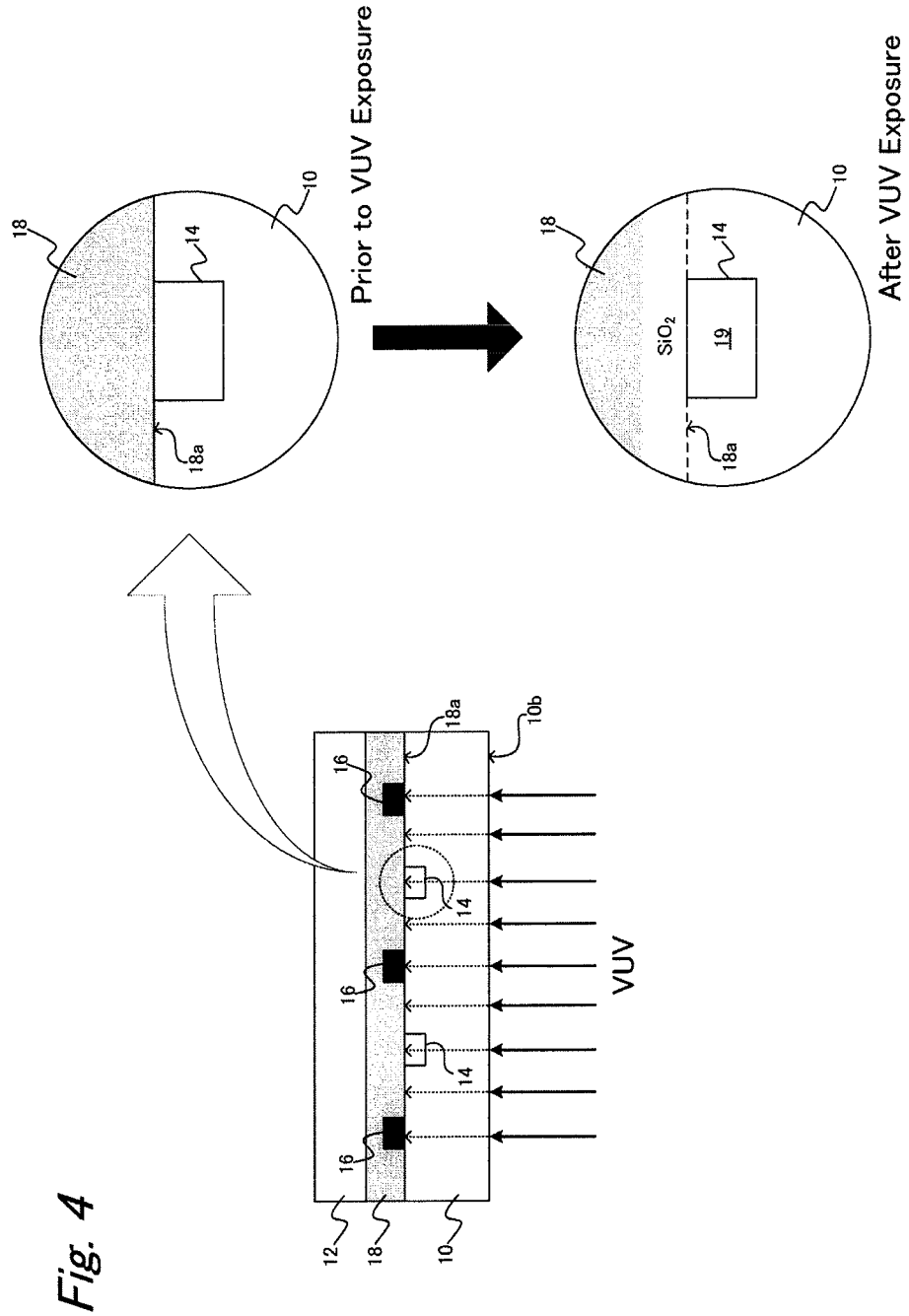
[FIG. 4] A scheme illustrates a process for exposing vacuum ultraviolet light.

Now, the process shown in FIG. 2(d) will be detailed by referring to FIG. 4. When the vacuum ultraviolet light (VUV) is irradiated toward the back face 10b of the major substrate 10 opposing to the surface being formed with the concave and convex structures, the irradiated vacuum ultraviolet light may pass the major substrate 10 and reach to the interface 18a on the major substrate 10 and the silicone resin layer 18 and further then may be absorbed around the interface 18a. As the result, the light oxidization reaction is take place around the interface 18a and the silicone resin being present in the part around the interface 18a may be converted to chemically stable silicon dioxides ($SiO_2$) so as to bind securely the major substrate 19 with the cover substrate 12. When assuming that the major substrate is made of quartz ($SiO_2$), all of the wall surfaces of the chamber (nano channel 19) defined by the concave structures 14 is made of silicon dioxides ($SiO_2$) as shown in the right lower circle of FIG. 4. Then, PDMS components could not be remained on the fluid path walls such that the wettability to water may be improved preferably.

The exposure process of the ultraviolet light also acts as the rinsing process for decomposition removal of organic residues inside the fluidic channels. That is to say, when PDMS is used for the microfluidic channel device, monomer ingredients of PDMS inevitably remain in the fluidic channels by oozing out or turning to gases of the monomer ingredients not yet polymerized. The remained PDMS ingredients may be converted to silicon dioxides ($SiO_2$) by the above ultraviolet light irradiation to integrate to the wall surface and then may be removed inside the fluidic channels. At the same time, residues of reagents may be decomposed and removed.

As described above, according to the present invention, the cover substrate may be adhered to the major substrate having the concave and convex structures on the surface in the condition that the cover substrate covers the convex structures and does not fill out the concave structures while making it possible to provide positioning of the substrates upon adhesion each other. Further more, according to the present invention, since any adhesive agent is not used, damages by solvents to the device may be avoided and the nano sized concave and convex structures may not be damaged after the adhesion between the major substrate and the cover substrate since the substrates may not deformed by heat.

As described above, the present invention has been described using embodiments and the present invention should not be limited by the above embodiments. Other embodiments made by a person with ordinary skill in the art should be included in the scope of this invention as far as such other embodiments have works and advantages of the present invention.

EXAMPLES

Hereafter, the present method will be described concretely using practical examples; however the present invention should also not be limited by the practical examples described herein below.

(Preparation of Test Specimen)

Silicone resin (SCR-1016, from Shin-Etsu Chemical Co., Ltd.) was used to prepare a test specimen for an adhesion force measurement experiment. Particularly, the resin mixed with the ratio of main agent:curing agent=1:1 was flown into a mold prepared beforehand and was degassed sufficiently in a desiccator. The resin mixture was heated at 100 Celsius degrees for one hour and then heated at 150 Celsius degrees for 5 hours to prepare the test specimen 20 shown in FIG. 5(a). As shown in FIG. 5(a), the test specimen 20 had the shape that the smaller column (diameter of 4 mm) to which the adhesion surface was formed and the larger column (diameter of 10 mm) which functioned as a holding part for the adhesion force measurement test. In addition, the test specimen for comparative example was prepared using the silicone rubber (SILPOT 184, from DOW CORNING TPRAY, Co., Ltd.). Particularly, the resin mixed with the ratio of main agent:curing agent=10:1 was flown into a mold was degassed sufficiently in a desiccator. The resin mixture was heated at 135 Celsius degrees for two hour to prepare the test specimen having the shape similar to the test specimen shown in FIG. 5(a).

(Excitation of Adhesion Surface and Adhesion)

Using a atmospheric plasma exposure apparatus (ST-7000, from KEYENCE CORPORATION) to expose (exposing distance of 6 mm) the test specimens (silicone resin/silicone rubber), the adhesion surfaces were excited and then the adhesion surfaces were contacted onto glass substrates quickly. After that, the specimens and the glass substrates were each adhered by pressurizing for 30 min.

Alternatively, using a vacuum ultraviolet exposure apparatus (UVS-1000SM, from USHIO INC.) the test specimen (silicone resin) was exposed at the exposure strength 18 $mW/cm^2$ (exposure distance of 3 mm) to excite the adhesion surface thereof and the specimen was similarly contacted onto a glass substrate to adhere the test specimen and the glass substrate by pressurizing for 30 min. The above excitation treatments was conducted by setting plural conditions about exposure time.

(Measurement of Adhesion Force)

With respect to each of the test specimens adhered onto the glass substrates by the above procedures, tensile tests were conducted by using the apparatus shown in FIG. 5(b). Particularly, the glass substrate 22 was fixed and the holding part of the test specimen 20 was hooked on the handle part 26 of the digital force gauge 24 (Z2-20N, from IMADA CO., LTD.) and then the tensile force (=adhesion force) was measured.

FIG. 6(a) shows relations between the exposure time (s) and the adhesion force ($N/mm^2$) for each of the silicone resin test specimens and silicone rubber test specimens when the adhesion surfaces were excited by the atmospheric plasma. In FIG. 6(a), the regions surrounded by broken lines indicate the cases that the test specimens were broken prior to the peeling out of the adhesion surface because the adhesion forces were stronger than the strength of the test specimens. Therefore, the region surrounded by the broken lines were evaluated that such test specimens had sufficient adhesion force required for practical usage; hereunder, the results in FIG. 6(b) were concluded along with the same standards.

When the excitation were carried out by the atmospheric plasma exposure, the silicone rubbers exhibited sufficient adhesion force at the exposure time between 0.3 and 2.5 seconds and no adhesion forces were observed at the exposure time longer than 3 seconds. In turn, the silicone resin showed sufficient adhesion force at the exposure time between 0.5 and 3 seconds as shown FIG. 6(a). After that, the adhesion forces were gradually lowered at the exposure time longer than 3 seconds and no adhesion force was observed at the exposure time longer than 60 seconds.

FIG. 6(b) shows relations between the exposure time (s) and the adhesion force ($N/mm^2$) for each of the silicone resin test specimens and silicone rubber test specimens when the adhesion surfaces were excited by the vacuum ultraviolet light. In the case of the vacuum ultraviolet light, the silicone rubber showed sufficient adhesion force at the exposure time from 1 to 2 seconds; however, the adhesion forces were gradually lowered at the exposure time over 2 seconds and no adhesion force was observed at the exposure time longer than 10 seconds. On the other hand, the silicone resin exhibited no adhesion force at all in the exposure time duration that the silicone rubber exhibited the adhesion forces; however, the silicone resin exhibited sufficient adhesion forces in the exposure time duration between 20 and 60 seconds. The calculation for the range of the total exposure energy amounts based on the apparatus exposure strength 18 $mW/cm^2$ was determined to be between 360 $mJ/cm^2$ and 1080 $mJ/cm^2$.

(Preparation of Single Molecule Sorter)

Using the present adhesion method of the substrates, the "one molecule sorter" was prepared according to the following procedures. First, to the surface of the quartz substrate (major substrate) recesses for nano fluidic channels (depths: 50-100 nm, widths: 50-500 nm) and the electrode strips having gaps with the width same with that of the nano fluid path recess (thickness: Ti (1 nm)/Au (100 nm), width: 100-1000 nm) were prepared.

On the other hand, to the surface of the quartz substrate of 100 micro-meters thickness (cover substrate) PDMS film (SIM 240, Shin-Etsu Chemical Co., Ltd.) of about 1 micrometer thickness was formed by a spin-coating method and then was baked and cured at about 150 Celsius degrees to prepare the silicone rubber film.

Methanol was dropped between the cover substrate and the major substrate and then contact holes formed in the cover substrate and the electrode strips on the major substrate were subjected to the positioning there between under the condition that the surface having the silicone rubber film of the cover substrate and the surface of the major substrate. Further then, both of the substrates was contacted and fixed under the pressure.

Finally, the vacuum ultraviolet light of 172 nm was exposed to the fixed both substrates from the major substrate side. The following TABLE 1 shows the composition ratios of the silicone rubber films after the exposure of VUV (1, 10, 120 seconds, respectively). The composition ratios were determined by X-ray photoelectron spectroscopy.

TABLE 1

| PDMS | Si | O | C [atomic %] |
|---|---|---|---|
| theoretical value | 25.0 | 25.0 | 50.0 |
| non-exposure | 22.3 | 29.3 | 48.4 |
| 1 sec exposure | 22.3 | 30.6 | 47.1 |
| 10 sec exposure | 23.7 | 39.7 | 36.6 |
| 120 sec exposure | 28.2 | 64.6 | 7.2 |

From the change in the composition ratios shown in the above TABLE 1, it was confirmed that the silicone rubber film was converted to $SiO_2$ from the silicone with respect to the VUV exposure time duration. Then, it was confirmed that the prepared "one molecule sorter" prepared according to the above procedures functioned without any problem.

DESCRIPTION OF SIGNS

10—major substrate
12—cover substrate
14—concave structure
16—convex structure
17—silicone rubber composition
18—silicone rubber layer
19—nano sized fluid path
20—test specimen
22—glass substrate
24—digital force gauge
26—handle part

The invention claimed is:

1. A method for adhering a major substrate and a cover substrate, the major substrate comprising a surface having both of convex structures and concave structures, the major substrate being transparent to ultraviolet light, the method comprising the steps of:
    applying a silicone rubber composition to a contact surface of a cover substrate;
    forming a silicone rubber layer at the contact surface of the cover substrate by curing the silicone rubber composition;
    contacting closely a surface of a major substrate and the silicone rubber layer of the cover substrate; and
    forming a silicone oxides film at an interface of the contact face between the silicone rubber layer and the major substrate by exposing the ultraviolet light from a major substrate side.

2. The method of claim 1, wherein the ultraviolet light is vacuum ultraviolet light.

3. The method of claim 1, wherein a wavelength of the vacuum ultraviolet light is 172 nm.

4. The method of claim 1, wherein the concave structures and convex structures are nano ordered sizes.

5. The method of claim 1, wherein the silicone rubber is a thermal cure type and the silicone rubber layer is formed by heating the silicone rubber composition from 60 Celsius degrees to 150 Celsius degrees.

6. The method of claim 1, wherein the major substrate is made of quartz.

7. A method of a microfluidic device comprising nano sized fluidic channels, the method comprising;
    providing a quartz substrate having a surface being formed with both of electrodes and fluidic channels and a cover substrate for encapsulating the quartz substrate;
    applying a silicone rubber composition at a contact face of the cover substrate;
    forming a silicone rubber layer at the contact face of the cover substrate by curing the silicone rubber composition;
    contacting closely between a face of the quartz substrate and the silicone rubber layer of the cover substrate; and
    forming a silicon oxide film at an interface of the contact face between the silicone rubber layer and the quartz substrate by exposing vacuum ultraviolet light from a side closest to the quartz substrate.

* * * * *